United States Patent [19]
Perret et al.

[11] Patent Number: 5,423,080
[45] Date of Patent: Jun. 6, 1995

[54] MICROWAVE TRANSCEIVER USING THE TECHNIQUE OF MULTILAYER PRINTED CIRCUITS

[75] Inventors: François Perret, Antony; Dominique Podvin, Bures sur Yvette; Jean-Pierre Susset, St Remy les Chevreuses, all of France

[73] Assignee: Thomson TRT Defense, Guyancourt, France

[21] Appl. No.: 842,473

[22] Filed: Feb. 27, 1992

[30] Foreign Application Priority Data

Mar. 12, 1991 [FR] France ............................ 91 02953

[51] Int. Cl.$^6$ ................................................ H04B 1/40
[52] U.S. Cl. .................................. 455/90; 455/300; 455/347
[58] Field of Search ................. 455/90, 128, 347, 349, 455/300, 351, 301, 310–312; 361/380, 395, 397, 399, 400, 401, 412, 415, 422, 424, 792, 795, 679, 736, 748, 752, 760, 761, 784, 796, 814, 816

[56] References Cited

U.S. PATENT DOCUMENTS

| | | | |
|---|---|---|---|
| 3,622,884 | 11/1971 | Kent | 455/90 |
| 4,658,334 | 4/1987 | McSparran et al. | 361/415 |
| 4,736,266 | 4/1988 | Tanibe | 361/792 |
| 4,739,448 | 4/1988 | Rowe et al. | 361/795 |
| 4,739,453 | 4/1988 | Kurokawa . | |
| 4,890,199 | 12/1989 | Beutler . | |
| 5,012,047 | 4/1991 | Dohya | 361/792 |
| 5,079,065 | 1/1992 | Masakazu et al. | 361/397 |
| 5,111,003 | 5/1992 | Kimbara | 361/792 |
| 5,165,984 | 11/1992 | Schoenthaler | 361/397 |

FOREIGN PATENT DOCUMENTS 0394053 10/1990 European Pat. Off. .

*Primary Examiner*—Reinhard J. Eisenzopf
*Assistant Examiner*—Nguyen Vo
*Attorney, Agent, or Firm*—Oblon, Spivak, McClelland, Maier, & Neustadt

[57] ABSTRACT

Microwave circuits, namely the circuits relating to the transmission-reception part and to the filtering of the microwave transceiver, are mounted on one and the same multilayer printed circuit and their electromagnetic insulation comprises, firstly, elements of the printed circuit such as conductive tracks on one of the faces of the printed circuit, metallized holes drilled in the tracks and close to one another so as to fulfil the role of an electromagnetic barrier and, at least in the case of some of them, a conductive plate and, secondly, attached elements with, especially, a thick metal lattice surmounted by a lid, the lattice resting on the conductive tracks.

5 Claims, 2 Drawing Sheets

5,423,080

MICROWAVE TRANSCEIVER USING THE TECHNIQUE OF MULTILAYER PRINTED CIRCUITS

BACKGROUND OF THE INVENTION

The present invention relates to microwave transceivers and, more particularly, to those using the technique of printed circuits for their transmission/reception and microwave filtering unit and for their modulation-demodulation unit. The making of these two units should take account of the fact that the transmission/reception and the filtering are done at a frequency of some gigahertz while the working frequency of the modulator/demodulator is considerably lower: of the order of 100 kHz.

Given its working frequency, the transmission/reception unit should be entirely shielded and not only should the transmission-reception be electromagnetically insulated from the filtering but also the circuits corresponding to the different functions relating to the transmission-reception should be strictly insulated from one another.

There are known transceivers working in microwave mode wherein, for transmission-reception, each function is carried out on an individual printed circuit. The different printed circuits are embedded in the housings of a metal piece carved from the block or obtained by molding and then machining. One or more lids are screwed on to the metal piece to close the housings. The microwave filter, which is of the type with resonator, is enclosed in a chamber that is formed by two half-shells fixed to the metal piece which contains the transmission-reception unit. The modulation-demodulation unit is mounted on a printed circuit that is proper to it. The internal connections of the transmission-reception and filtering unit are made by holes drilled in the partitions. The connections between the transmission-reception and filtering unit and the rest of the transmitter, including the modulation-demodulation unit, are made by using bypass circuits.

These known embodiments of microwave transceivers have certain drawbacks: owing to the number of parts to be assembled, the operations of mounting and dismantling the devices are lengthy, and there are substantial risks of microwave leakage. Furthermore, the making of the connections between the different printed circuits is a very delicate task.

SUMMARY OF THE INVENTION

The present invention is aimed at circumventing or at least at reducing these drawbacks.

This is obtained by the use of a single printed circuit to mount both the transmission-reception and filtering unit and the modulation-demodulation unit. Furthermore, all the connections relating to these two units can be made in the printed circuit, at least up to a connector with several contacts that is fixedly joined to the printed circuit, when the connection also relates to a unit other than the two above-mentioned units.

According to the present invention, there is provided a microwave transceiver comprising a first unit relating to the modulation-demodulation, a second unit with first microwave circuits relating to the transmission-reception functions and a second microwave circuit relating to the microwave filtering function, a multilayer printed circuit with a first face on which there is mounted the first unit, with an internal layer constituted, at least partially, by a conductive plate, with a second face having conductive tracks that form an irregular conductive grid defining compartments, and conductive connections within the compartments, and with metallized holes, or via metallized holes, that form lines of dots in the tracks and are located at distances from one another that are notably smaller than the working wavelengths of the transceiver, a thick conductive lattice having walls that lie on the tracks and cover them entirely, and a conductive lid that covers the lattice, wherein the microwave circuits are positioned in the compartments with a one-to-one relationship between the compartments and the functions and wherein the tracks, the lattice, the metallized holes and, at least for the transmission-reception functions, the plate and the lid form casings which determine electromagnetic protection volumes and which enclose the microwave circuits.

BRIEF DESCRIPTION OF THE DRAWINGS

The present invention shall be understood more clearly and other characteristics shall appear from the following description and from the figures pertaining thereto. Of these figures.

In these figures, the corresponding elements are designated by the same references.

MORE DETAILED DESCRIPTION

Figure 1:
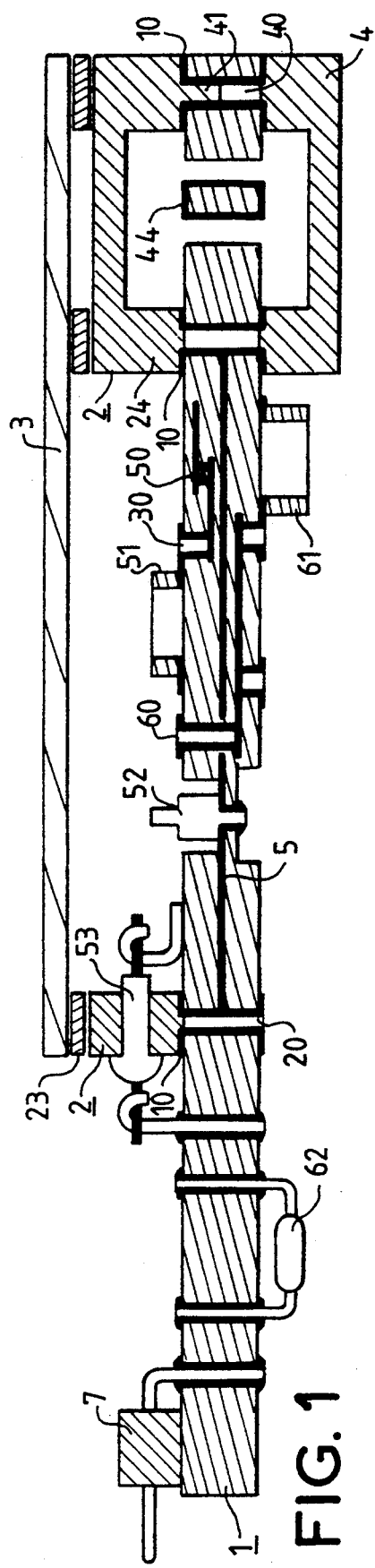
FIGS. 1 and 2 show sectional views of parts of transceivers according to the invention.

FIG. 1 shows a multilayer printed circuit 1 on which there are mounted different components as well as, on its upper face, a thick, conductive, metal lattice 2 closed by a metal lid 3 associated with an electromagnetic seal 23. A metal half-shell 4 is mounted on the lower face of the circuit 1.

Figure 2:
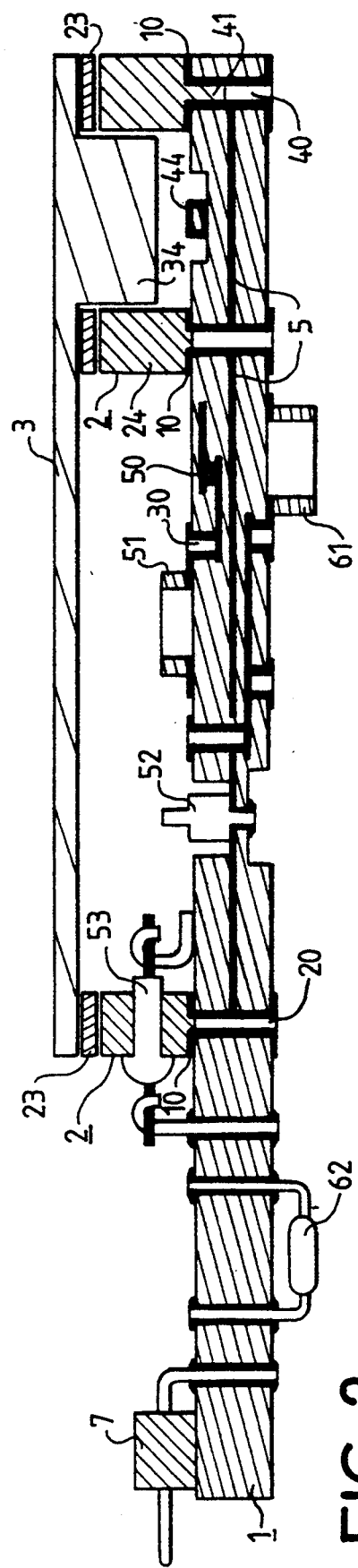
Figure 3:
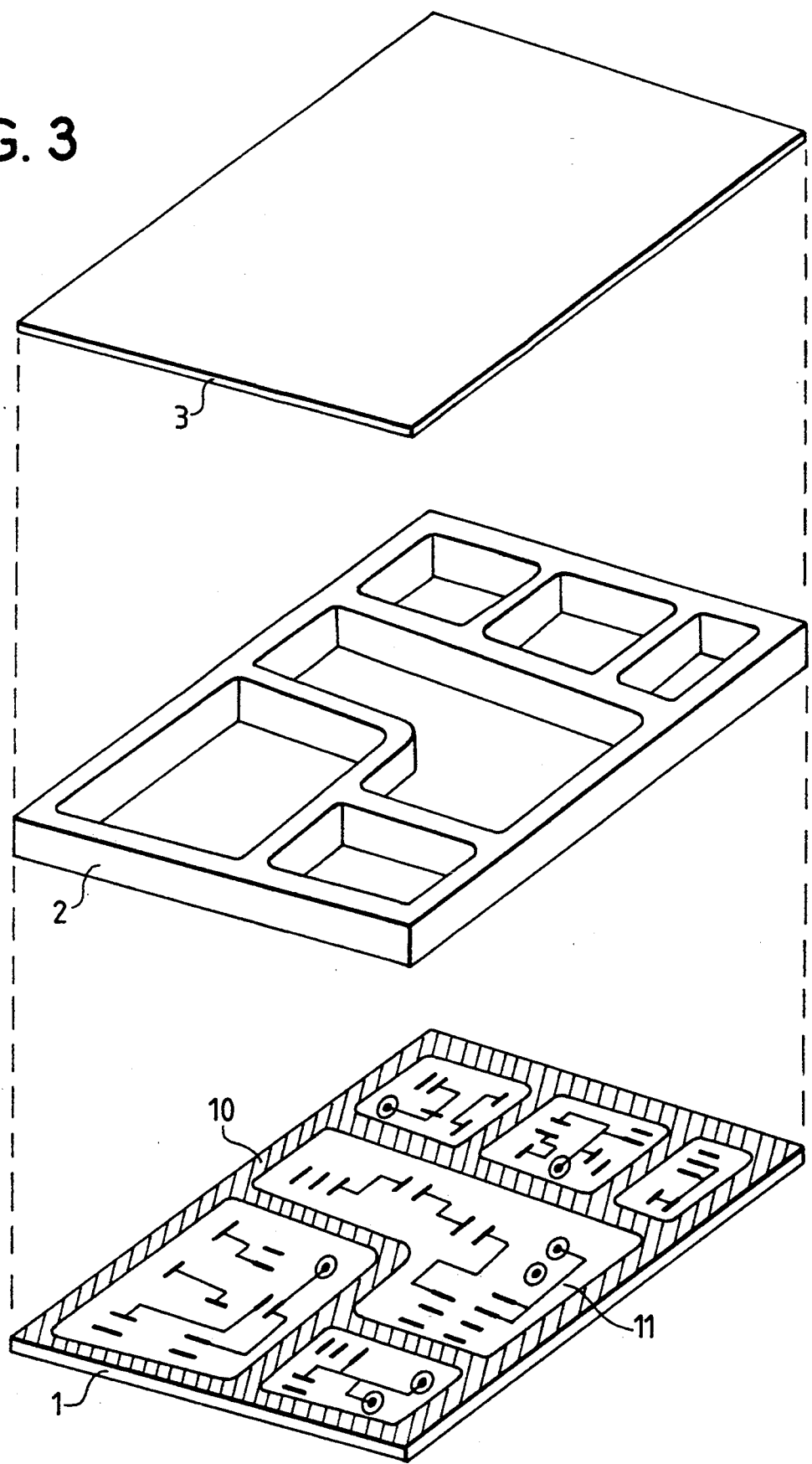
FIG. 3 shows a view in perspective of elements that go into the making of a transceiver according to the invention.

FIG. 3 shows a view, in perspective and before assembly, of the manner of making a multilayer printed circuit 1, a thick conductive lattice 2 and a conductive lid 3 designed for a transceiver according to the invention which, as it happens, is not that of FIG. 1 or even that of FIG. 2; this makes it possible to see a greater number of embodiments and to note their common characteristics, namely:

a printed circuit, of which the upper layer, which will be called a support layer, has an irregular grid 10 formed by wide conductive tracks with conductive links such as 11 within compartments defined by this grid: it must be noted that, to simplify the drawing, the metallized holes such as the holes 20 and 40 of FIGS. 1 and 2 have not been shown in FIG. 3 where they would have been shown as a line of dots positioned substantially in the middle of the conductive tracks of the grid 10, a conductive lattice 2 which reproduces the pattern of the grid 10 in thickness and is designed to be soldered to this grid, a lid 3 with the external dimensions of the lattice on which it is mounted by means of a set of screws (not shown) that go through the lid to penetrate threaded holes drilled in the lattice. In a standard way, the assembly further includes a flexible electromagnetic seal (not shown) which itself also reproduces the pattern of the grid 10 and is designed to be mounted between the lattice and the lid; a seal such as this is shown in FIGS. 1 and 2 where it bears the reference 23 and where, to clearly distinguish the lid 3 from the seal 23 and from the lattice 2, these three elements have been slightly moved away from one another whereas, after mounting by means of screws, they are perfectly joined to one another.

A part of the lattice 2 according to FIG. 1 constitutes a half-shell 24 and the two half-shells 4 and 24 are positioned so as to constitute a shell. The interior of this shell encloses a microwave filter, only one stub 44 of which is seen in FIG. 1. The edges of the two half-shells are connected by metallized holes such as 40, evenly arranged at about 5 mm from one another. Given a working frequency of 4.3 GHz for the filter which encloses the shell, these metallized holes are at a distance from one another that is smaller than one-twentieth of the working wavelength in the substrate of the printed circuit 1; these holes therefore form a screen to the microwaves created within the shell by the filter.

Other metallized holes such as 20, also placed away from one another at distances of about 5 mm, form the connection between the other parts of the lattice, which lie on the printed circuit 1, and a conductive plate 5. The plate 5 constitutes a partial internal layer of the printed circuit 1. It is placed directly in front of the lattice 2, except inside the shell where it is absent. Thus, the lattice 2, the lid 3, the metallized holes such as 20 and the plate 5 determine volumes that are electromagnetically protected, as is the interior of the shell 24-4. Within these protected volumes, there are mounted the electronic circuits corresponding to the different functions of the transmission-reception part proper of the transceiver considered.

The electromagnetic protection elements that thus surround the transmission-reception part and the microwave filtering constitute, for the external environment, a screen against the microwave disturbances produced by the circuits located within volumes that they demarcate. This enables the modulation-demodulation part of the transceiver to be mounted on the lower face of the multilayer printed circuit, where this face is not covered by the half-shell 4.

FIG. 1 shows a certain number of components mounted on the printed circuit: a surface-mounted component 51 and a component 52 with special mounting in the microwave part; a surface-mounted component 61 and a standard component 62 in the transmission-reception part. The connections between the microwave part and the modulation-demodulation part are done by metallized holes such as 60 or metallized holes associated with bypass circuits such as the circuit 53.

The links with the rest of the transceiver are provided by an ordinary multicontact connector 7 soldered to the printed circuit.

In order to facilitate the connecting of the lattice to the printed circuit 1 and to strengthen this connection mechanically, the lattice has pins, such as 41, which are embedded in certain of the metallized holes, such as 40, of the grid 10.

Furthermore, it must be noted that those layers of the printed circuit 1 which are located on the microwave part side have been made of polytetrafluoroethylene laminate, in view of the high performance characteristics of this material in microwave applications, while the other layers have been made of epoxy resin laminate in view of the attractive price of this widely available laminate.

FIG. 2 corresponds to an alternative embodiment of the transceiver of FIG. 1, in which the filtering part alone is different. The half-shell 4 has been eliminated and replaced by a conductive layer in the printed circuit. Besides, this layer is only the layer 5 according to FIG. 1 but is more extensive so as to be in front of the microwave filter. In this variant, the upper half-shell 24 is closed by the lid 3 while, in the embodiment according to FIG. 1, the half-shell 24 was a single piece, the lid 3 therefore having no role of electromagnetic protection with respect to the microwave filter. It should be furthermore noted that, in the embodiment according to FIG. 2, the stub 44 is thinner than in the embodiment according to FIG. 1 because it cannot take the entire thickness of the circuit. This is why, in order to keep the same working frequency, the volume of the cavity which has already been reduced by the elimination of the lower half-shell is further reduced by a protuberance 34 from the lid 3, this protuberance being thicker than the bottom, parallel to the printed circuit 1, of the half-shell 24 according to FIG. 1.

The present invention is not limited to the examples described. It is thus that the metal lattice may be constituted by several meshes joined together, for example, by soldering.

In the same way, the technology of printed circuits, with its metallized holes, enables the insertion of a sandwiched heat sink: a metal plate may be positioned within the stack of the layers of the printed circuit, and this plate may be constituted by the plate 5, provided that it is given sufficient thickness for the desired calorie-discharging effect.

What is claimed is:

1. A microwave transceiver comprising, on a single printer circuit board: a first unit performing a modulation-demodulation function, a second unit with first microwave circuits performing transmission-reception functions and a second microwave circuit performing a microwave filtering function, a multilayer printed circuit with a first face on which there is mounted the first unit and a second face on which is mounted said second unit, said multilayer printed circuit having an internal layer constituted, at least partially, by a conductive plate, with said second face having conductive tracks that form an irregular conductive grid defining compartments, and conductive connections within the compartments, and with metallized holes, that form lines of dots in the tracks and are located at distances from one another that are substantially smaller than the working wavelength of the transceiver, a thick conductive lattice having walls that lie on the tracks and cover said tracks entirely, and a conductive lid that covers the lattice, wherein the first and second microwave circuits are positioned in the compartments with a corresponding one-to-one relationship between the compartments and the functions performed and wherein the tracks, the lattice, the metallized holes and the conductive plate and the lid define casings which determine electromagnetic protection volumes at least for the transmission reception functions and which enclose the first and second microwave circuits.

2. A transceiver according to claim 1, wherein the conductive plate is limited, in extent, to a part of the printed circuit on which the first and second microwave circuits are located and wherein the casing that encloses the second microwave circuit comprises two half-shells, the first one of said two half-shells forms part, at least partially, of the lattice and the second one of which is positioned on the second face of the printed circuit therefor.

3. A microwave transceiver comprising, on a single printed circuit board: a first unit performing a modulation-demodulation function, a second unit with first microwave circuits performing transmission-reception functions and a second microwave circuit performing a microwave filtering function, a multilayer printed circuit with a first face on which there is mounted the first unit a second face on which is mounted said second unit, said multilayer printed circuit having an internal layer constituted, at least partially, by a conductive plate, with said second face having conductive tracks that form an irregular conductive grid defining compartments, and conductive connections within the compartments, and with metallized holes, that form lines of dots in the tracks and are located at distances from one another that are substantially smaller than the working wavelength of the transceiver, a thick conductive lattice having walls that lie on the tracks and cover said tracks entirely, and a conductive lid that covers the lattice, wherein the first and second microwave circuits are positioned in the compartments with a corresponding one-to-one relationship between the compartments and the functions performed and wherein the tracks, the lattice, the metallized holes and the plate and the lid form casings which determine electromagnetic protection volumes at least for the transmission-reception functions and which enclose the first and second microwave circuits, wherein the conductive plate extends at least throughout a part of the printed circuit on which the second unit is mounted and wherein the casing that encloses the second microwave circuit comprises, firstly, a half-shell that forms part of the lattice and, secondly a part of the plate above which the half-shell is located.

4. A transceiver according to claim 1, wherein the second microwave circuit has stubs made in the thickness of the printed circuit.

5. A transceiver according to claim 1 that includes a multicontact connecter fixed to the printed circuit to provide for the connections between the first unit and the second unit.

* * * * *